(12) United States Patent
Nishioka

(10) Patent No.: US 10,468,567 B2
(45) Date of Patent: Nov. 5, 2019

(54) LIGHT-EMITTING DEVICE AND METHOD OF MANUFACTURING THE SAME

(71) Applicant: NICHIA CORPORATION, Anan-shi, Tokushima (JP)

(72) Inventor: Yoshihiko Nishioka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/712,377

(22) Filed: Sep. 22, 2017

(65) Prior Publication Data

US 2018/0090649 A1 Mar. 29, 2018

(30) Foreign Application Priority Data

Sep. 28, 2016 (JP) .................. 2016-189446

(51) Int. Cl.
| | | |
|---|---|---|
| *H01L 33/58* | (2010.01) | |
| *H01L 33/54* | (2010.01) | |
| *H01L 33/60* | (2010.01) | |
| *H01L 33/50* | (2010.01) | |
| *H01L 33/56* | (2010.01) | |

(52) U.S. Cl.
CPC ............. *H01L 33/58* (2013.01); *H01L 33/54* (2013.01); *H01L 33/60* (2013.01); *H01L 33/505* (2013.01); *H01L 33/56* (2013.01); *H01L 2933/005* (2013.01); *H01L 2933/0041* (2013.01); *H01L 2933/0058* (2013.01)

(58) Field of Classification Search
CPC .................................................. H01L 25/0753
See application file for complete search history.

(56) References Cited

U.S. PATENT DOCUMENTS

| | | | | |
|---|---|---|---|---|
| 6,345,903 B1 * | 2/2002 | Koike | ................... | H01L 33/486 257/E33.059 |
| 8,540,394 B2 * | 9/2013 | Veerasamy | ........ | G02B 27/0927 362/235 |
| 8,581,284 B2 * | 11/2013 | Seko | ....................... | H01L 33/50 257/98 |
| 2002/0063301 A1 * | 5/2002 | Hanamoto | ............ | H01L 33/502 257/432 |

(Continued)

FOREIGN PATENT DOCUMENTS

| | | |
|---|---|---|
| JP | 11-261111 A | 9/1999 |
| JP | H11-261110 A | 9/1999 |

(Continued)

*Primary Examiner* — Kyoung Lee
*Assistant Examiner* — Christina A Sylvia
(74) *Attorney, Agent, or Firm* — Global IP Counselors, LLP

(57) ABSTRACT

A light-emitting device includes a light-emitting element, a wavelength conversion member, a light-reflective member and a light-distributing member. The wavelength conversion member is arranged on the light-emitting element. The light-reflective member covers lateral surfaces of the light-emitting element. The light-distributing member is made of silicon and defines a through-hole disposed above the wavelength conversion member. The upper edge of the through-hole defined by an upper surface of the light-distributing member is disposed on an inner side of an outer edge of the light-emitting element in plan view.

10 Claims, 5 Drawing Sheets

(56) References Cited

U.S. PATENT DOCUMENTS

| | | | | |
|---|---|---|---|---|
| 2007/0257373 A1* | 11/2007 | Akram | ............. | H01L 21/76898 257/774 |
| 2008/0283860 A1* | 11/2008 | Suehiro | ................ | G02B 6/0031 257/98 |
| 2011/0235362 A1* | 9/2011 | Liu | ...................... | G02B 6/0053 362/606 |
| 2014/0203306 A1* | 7/2014 | Ito | ......................... | H01L 33/505 257/88 |
| 2015/0108523 A1* | 4/2015 | Kotani | ................. | H01L 33/505 257/98 |
| 2015/0188004 A1* | 7/2015 | Ozeki | .................. | H01L 33/507 257/98 |
| 2016/0163932 A1* | 6/2016 | Brandl | ................. | H01L 33/505 438/29 |
| 2016/0247987 A1 | 8/2016 | Ito | | |
| 2016/0351760 A1* | 12/2016 | Hayashi | ................. | H01L 33/58 |

FOREIGN PATENT DOCUMENTS

| | | |
|---|---|---|
| JP | 2005-276895 A | 10/2005 |
| JP | 2008-181932 A | 8/2008 |
| JP | 2010-283281 A | 12/2010 |
| JP | 2014-127679 A | 7/2014 |
| JP | 2014-143300 A | 8/2014 |
| JP | 2016-018921 A | 2/2016 |
| JP | 2016-115703 A | 6/2016 |

\* cited by examiner

LIGHT-EMITTING DEVICE AND METHOD OF MANUFACTURING THE SAME

CROSS-REFERENCE TO RELATED APPLICATION

This application claims priority to Japanese Patent Application No. 2016-189446 filed on Sep. 28, 2016, the disclosure of which is hereby incorporated by reference in its entirety.

BACKGROUND OF THE INVENTION

1. Field of the Invention

The present disclosure relates to a light-emitting device and a method of manufacturing the same.

2. Description of Related Art

Light-emitting devices employing combinations of light-emitting elements and wavelength conversion members have been put in various applications such as light sources for vehicles, and further improvement in light extraction efficiency of the light-emitting devices is required.

In view of this, a light-emitting device is proposed that has an aperture or the like at an a light-emitting side for reducing spread of light, which allows for effectively improving light extraction efficiency (for example, see Japanese Unexamined Patent Application Publication No. 2014-127679 and Japanese Unexamined Patent Application Publication No. 2014-143300).

SUMMARY OF THE INVENTION

On the light-extracting surface, through which light emitted from a light-emitting element is extracted, of the light emitting device, members to be irradiated with the light, such as a light-reflective member, tends to be deteriorated over time due to large output of the emitted light. This may lead to difficulty in maintaining a shape and function of such members, which may cause leakage of light.

The present disclosure has been made in view of the above problem, and provides a reliable light-emitting device with a high luminance in which light distribution can be controlled and a material not easily affected by light irradiation over time can be selected for a member irradiated with light on the light-extracting side, and a method of manufacturing the light-emitting device.

A light-emitting device includes a light-emitting element, a wavelength conversion member, a light-reflective member and a light-distributing member. The wavelength conversion member is arranged on the light-emitting element. The light-reflective member covers lateral surfaces of the light-emitting element. The light-distributing member is made of silicon and defines a through-hole disposed above the wavelength conversion member. The upper edge of the through-hole defined by an upper surface of the light-distributing member is disposed on an inner side of an outer edge of the light-emitting element in plan view.

A method of manufacturing a light-emitting device includes: providing a substrate; etching the substrate to form a light-distributing member defining a plurality of through-holes each having inclined inner walls; disposing a plurality of wavelength conversion members respectively above a plurality of light-emitting elements, the light-emitting elements being configured to emit light from upper surfaces thereof; and disposing the light-emitting elements and the wavelength conversion members respectively below each of the through-holes of the light-distributing member.

According to the present disclosure, a reliable light-emitting device with high luminance in which light distribution can be controlled and a material not easily affected by light irradiation over time can be selected for a member to be irradiated with light on the light-extracting side, and a method of manufacturing the light-emitting device.

DETAILED DESCRIPTION OF EMBODIMENTS

Certain embodiments of the present invention will be described referring to the accompanying drawings as appropriate. The descriptions below are intended to embody the technical concept of the present disclosure and do not limit the scope of the present invention to the description in the below unless specifically stated otherwise. Constitutions described in one embodiment or one example can be applied to other embodiments and examples.

It should be noted that size or positional relationship of members illustrated in each drawing may be exaggerated in order to clarify the descriptions.

First Embodiment: Light-Emitting Device

Figure 1A:
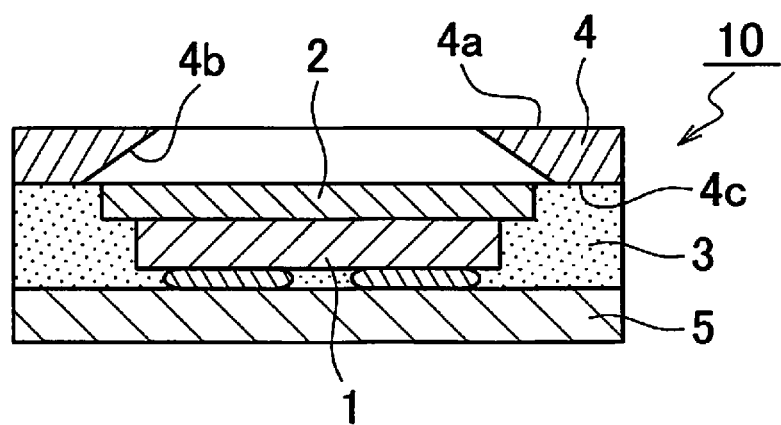
FIG. 1A is a schematic cross-sectional view of a light-emitting device according to one embodiment of the present disclosure.

As shown in FIG. 1A, a light-emitting device in the present embodiment includes a light-emitting element 1, a wavelength conversion member 2 on the light-emitting element 1, a light-reflective member 3 covering lateral surfaces of the light-emitting element 1, and a light-distributing member 4 above the wavelength conversion member 2. The light-distributing member 4 has a through-hole 4b having an edge in at least an upper surface 4a of the light-distributing member 4 located at an inner side of an outer edge of the light-emitting element 1.

The through-hole 4b is located above the wavelength conversion member 2. The light-distributing member 4 has a light-shielding property or a light-reflecting property, or a light-shielding film or a light-reflective film is disposed on a surface of the light-distributing member 4, which allows light to be emitted through the through-hole 4b.

In such a light-emitting device, light emitted from the light-emitting element can be efficiently extracted toward an upper side, and light extracted from the light-emitting element can be kept within a narrow region.

Accordingly, light with high luminance can be efficiently extracted.

Figure 1B:
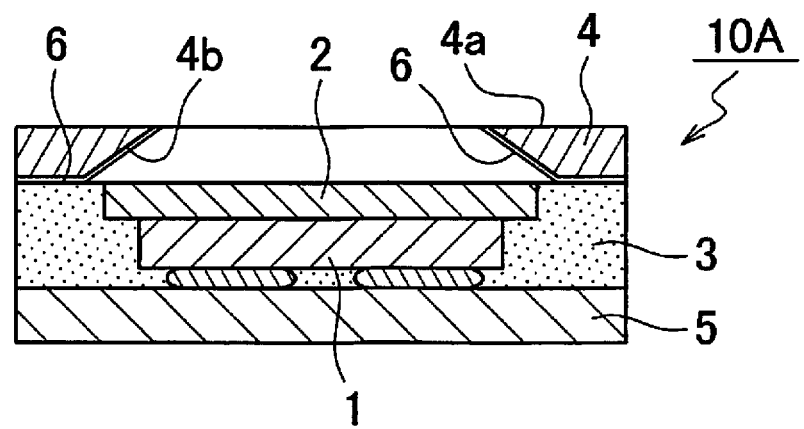
FIG. 1B is a schematic cross-sectional view of a light-emitting device according to variant example of the present disclosure.

The light-emitting device preferably further includes a reflective film 6 one or more inner walls of the light-distributing member 4 that define the through-hole 4b as shown in FIG. 1B, and preferably includes a support substrate 5 on which the light-emitting element 1 is disposed as shown in FIG. 1A and FIG. 1B.

Light-Emitting Element 1

For example, a semiconductor light-emitting element such as a light-emitting diode can be used for the light-emitting element 1. The light-emitting element may include a light-transmissive substrate and a semiconductor layered body disposed on the light-transmissive substrate. For example, a light-transmissive insulating material such as sapphire ($Al_2O_3$) or a light-transmissive semiconductor material (for example, a nitride semiconductor material) that transmits light from the semiconductor layered body can be used for the light-transmissive substrate.

The semiconductor layered body includes a plurality of semiconductor layers such as an n-type semiconductor layer, a light-emitting layer (i.e., active layer), and a p-type semiconductor layer. Examples of a material of the semiconductor layers include semiconductor materials such as group III-V compound semiconductors and group II-VI compound semiconductors. More specifically, a nitride semiconductor material such as $In_XAl_YGa_{1-X-Y}N$ (0≤X, 0≤Y, X+Y≤1) can be used.

The light-emitting element 1 may have a plurality of electrodes on the same surface or have the plurality of electrodes on different surfaces. A good electrical conductor such as metals including Cu is preferably used for the plurality of electrodes.

For example, the light-emitting element 1 is preferably disposed on the support substrate 5. In this case, the light-emitting element may be face-down mounted or face-up mounted on the support substrate 5. The support substrate 5 may be made of any material and/or may have any structure that allows the support substrate 5 to support the light-emitting element 1. The support substrate 5 may have any appropriate thickness.

For example, the thickness is in a range of about 0.2 mm to 5 mm. The support substrate 5 may have any appropriate shape and size, and the shape and the size of the support substrate may be adjusted as appropriate in accordance with the shape and the size of the light-emitting device to be obtained. Examples of a planar shape of the support substrate 5 include polygons such as rectangles, circles, ellipses, and shapes close to these shapes. The support substrate 5 may have an irregular surface but preferably has a flat plate shape or a sheet shape with a flat surface.

The support substrate 5 is preferably, for example, a wiring board including a base and wirings. The base can be made of a material selected from resins (including fiber-reinforced resins), ceramics, glass, metals, paper, composite materials of these, and the like.

For example, an adhesive tape used in the field of semi-conductor manufacturing in which an adhesive layer is disposed on a plastic sheet can be used. Examples of the resins include epoxy resins, glass epoxy resins, bismaleimide-triazine (BT) resins, and polyimides. Examples of the ceramics include aluminum oxide, aluminum nitride, zirconium oxide, zirconium nitride, titanium oxide, titanium nitride, and mixtures of these materials.

In the case where a metal is used for the base, examples of the metal include copper, iron, nickel, chromium, aluminum, silver, gold, titanium, or alloys of two or more of these metals.

In the case of using a flexible substrate, a material such as polyimides, poly(ethylene terephthalate), poly(ethylene naphthalate), liquid crystal polymers, or cycloolefin polymers may be used for the base.

A metal member (such as Cu and Al), an insulating ceramic, or the like may be further disposed on a lower surface of the support substrate 5 in consideration of heat dissipation performance.

The wirings are formed at least on the upper surface of the base, and may be further formed at the inside, on a lateral surface, and/or on the lower surface of the base. Each of the wirings preferably includes an element-mounting portion on which the light-emitting element is mounted, terminal portions connected to the outside, and a lead wiring portion connecting these portions. The wiring can be formed of copper, iron, nickel, tungsten, chromium, aluminum, silver, gold, titanium, palladium, rhodium, or an alloy of these metals. A single layer or multiple layers made of one or more of these metals or alloys of two or more of these metals may be used. In particular, copper or a copper alloy is preferable in view of heat dissipation performance. A layer made of silver, platinum, aluminum, rhodium, gold, an alloy of two or more of these metals, or the like may be disposed on a surface of the wiring in view of wettability and/or the light-reflectivity of bonding members.

Generally, the light-emitting element is preferably fixed on the support substrate via connecting members made of a metal material such as Au-based solder materials (e.g., AuSn-based solder, AuGe-based solder, AuSi-based solder, AuNi-based solder, AuPdNi-based solder, or the like) and Ag-based solder materials (e.g., AgSn-based solder). In this case, the light-emitting element may be face-down mounted on the support substrate, or may be face-up mounted and electrically connected via wires.

Wavelength Conversion Member 2

The wavelength conversion member 2 contains a wavelength conversion substance such as phosphors and preferably has a size that allows for covering an entirety of the light-emitting element in a top view, in other words, when viewed from the light-extracting surface. This structure enables wavelength conversion of the entire light from the light-emitting element and allows for easily enhancing the luminance.

The wavelength conversion member preferably has a substantially uniform thickness at least in a region to serve as the light-extracting surface above the light-emitting element, and more preferably has a plate shape or a sheet shape. The thickness of the wavelength conversion member is, for example, in a range of 10 μm to 200 μm.

A phosphor used for the wavelength conversion substance may be any of phosphors that can be excited by light emitted from the light-emitting element and emit light having different wavelengths. Examples of phosphors include:

(i) Garnet-based phosphors such as aluminum-garnet phosphors (for example, cerium-activated yttrium-aluminum-garnet (YAG) phosphors and cerium-activated lutetium-aluminum-garnet (LAG) phosphors);
(ii) Europium- and/or chromium-activated nitrogen-containing calcium aluminosilicate ($CaO—Al_2O_3—SiO_2$) phosphors;
(iii) Europium-activated silicate (($Sr,Ba)_2SiO_4$) phosphors;
(iv) β-SiAlON phosphors;
(v) Nitride phosphors such as CASN ($CaAlSiN_3$:Eu) and SCASN phosphors;
(vi) Rare-earth nitride phosphors such as $LnSi_3N11$ and LnSiAlON phosphors (where Ln is a rare-earth element);
(vii) Oxynitride phosphors such as $BaSi_2O_2N_2$:Eu and $Ba_3Si_6O_{12}N_2$:Eu phosphors;
(viii) Manganese-activated fluoride-complex phosphors (for example, KSF ($K_2SiF_6$:Mn) phosphors);
(ix) Sulfide phosphors such as CaS (CaS:Eu), $SrGa_2S_4$ ($SrGa_2S_4$:Eu), $SrAl_2O_4$, and ZnS phosphors; and
(x) Chlorosilicate phosphors.

For the wavelength conversion substance, a semiconductor material such as group II-VI, group III-V, and group IV-VI semiconductors, specifically so-called nanocrystals, which are nano-sized highly dispersible particles such as CdSe, core-shell $CdS_xSe_{1-x}$/ZnS, and GaP, or light-emitting substances called quantum dots (Q-dots) may be used. Because quantum-dot phosphors are unstable, the surfaces of quantum-dot phosphors may be covered or stabilized with poly(methyl methacrylate) (PMMA), a silicone resin, an epoxy resin, or a hybrid resin of these resins.

The wavelength conversion member 2 may be a sintered body of a phosphor, a sintered body of a fluorescent substance and an inorganic substance (for example, alumina), or a member in which a phosphor is dispersed in a light-transmissive member. The light-transmissive member can be made of, for example, glass or a resin. The light-transmissive member can be made of a light-transmissive resin used for sealing in a typical light-emitting device in which a light-emitting diode or the like is mounted. Examples of the light-transmissive resin include silicone resins, epoxy resins, phenolic resins, polycarbonate resins, acrylic resins, or modified resins or hybrid resins of one or more of these, and glass. These materials can be used singly, or two or more of these materials can be used in combination. In the wavelength conversion member, in addition to the wavelength conversion substance, a colorant, a light-diffusing material, a filler, or the like may be contained in the light-transmissive resin, in accordance with the purpose of use or intended application.

The wavelength conversion member 2 may have a single-layer structure or a layered structure. In the case of having a layered structure, the layers may contain different wavelength conversion substances and/or different light-transmissive members, may include a layer not containing the wavelength conversion substance but made of only the light-transmissive member, or may include a layer containing a light-diffusing material instead of the wavelength conversion substance. The layer not containing the wavelength conversion substance but made of only the material or the layer containing a light-diffusing material instead of the wavelength conversion substance is preferably disposed at a side farther from the light-emitting element in the light-transmissive member. This structure allows for improving resistance to heat, light, and the like regardless of the type of the wavelength conversion substance.

Examples of the light-diffusing material and the filler include inorganic particles such as barium titanate, titanium oxide, aluminum oxide, silicon oxide, or calcium carbonate, organic particles such as silicone resins or acrylic resins, and a glass powder (preferably a glass powder having an adjusted refractive index). These materials can be used singly, or two or more of these materials may be used in combination.

Light-Reflective Member 3

The light-reflective member 3 can reflect light emitted from the light-emitting element and can reflect, for example, preferably 70% or more of light emitted from the light-emitting element. The light-reflective member 3 can be made of, for example, a light-reflective resin. Examples of the light-reflective resin include a light-transmissive resin in which a light-reflective substance is dispersed. Examples of the light-reflective substance include titanium oxide, silicon dioxide, zirconium dioxide, potassium titanate, alumina, aluminum nitride, boron nitride, and mullite. For the light-reflective substance, a substance with a granular shape, fibrous shape, or flaky shape can be used. The light-transmissive resin can be selected from the above-described materials.

The light-reflective member 3 covers the lateral surfaces of the light-emitting element. It is preferable that the light-reflective member 3 also covers a lower surface of the light-emitting element 1. In the case where the light emitting device 10 includes the support substrate 5, the light-reflective member 3 preferably also covers the gap between the light-emitting element 1 and the support substrate 5. It is more preferable that the light-reflective member 3 covers continuously entirely from the lateral surfaces of the light-emitting element to the lateral surfaces of the wavelength conversion member. Further, an upper surface of the light-emitting element is preferably not covered by the light-reflective member 3.

Light-Distributing Member 4

The light-distributing member 4 is disposed above the light-emitting element 1. More specifically, the light-distributing member 4 is disposed above the light-emitting element 1 and the wavelength conversion member 2. The light-distributing member 4 has the through-hole 4b through which light emitted from the light-emitting element 1 passes. Accordingly, the through-hole is located above the light-emitting element 1 and/or the wavelength conversion member 2, preferably above the light-emitting element 1 and the wavelength conversion member 2. A top view shape of the through-hole may differ from a top view shape of the light-emitting element, but is preferably the same as (or similar to) the top view shape of the light-emitting element.

The light-distributing member 4 preferably has inner walls defining the through-hole 4b that are inclined from an outer edge of the through-hole on the upper surface 4a toward an outer edge of the through-hole on a lower surface 4c. In other words, it is preferable that the opening on the upper surface 4a has a smaller width and the opening on the lower surface 4c has a larger width. The through-hole 4b preferably has an outer edge at an inner side of an outer edge of the light-emitting element 1 at least in the upper surface 4a. Further, the through-hole 4b preferably has an outer edge at an outer side of an outer edge of the light-emitting element 1 in the lower surface 4c of the light-distributing member 4 to efficiently extract light from the light-emitting element 1. Furthermore, the through-hole 4b preferably has an outer edge at an inner side of the outer edge of the wavelength conversion member 2 on the upper surface 4a of the light-distributing member 4, and preferably has an outer edge at an outer side of the outer edge of the wavelength conversion member 2 on the lower surface 4c. For example, the through-hole 4b has a depth corresponding to the thickness of the light-distributing member.

The depth of the through-hole 4b is, for example, in range of 50 µm to 1,000 µm. Accordingly, the walls defining the through-hole in the light-distributing member 4 are inclined at an angle of 35 degrees to 60 degrees, preferably 45 degrees to 55 degrees, with respect to the upper or lower surface of the light-distributing member 4.

The light-distributing member 4 can be made of a light-shielding or reflective material selected from various metals and nonmetals.

Examples of materials include insulating materials such as glass epoxy resins, resins (including fiber-reinforced resins), ceramics (e.g., HTCC and LTCC), glass, paper, and composite materials of two or more of these materials. Examples of a metal material for the light-distributing member 4 include copper, gold, silver, and aluminum. Examples of a nonmetal material for the light-distributing member 4 include silicon, sapphire, ceramic materials (for example, alumina, aluminum nitride, and mullite), and substrates made of combinations of these ceramic materials and insulating materials (for example, BT resins, glass epoxy resins, and epoxy based resins). Examples of a resin material for the light-distributing member 4 include thermosetting resins such as epoxy resins, triazine-derivative epoxy resins, modified epoxy resins, silicone resins, modified silicone resins, acrylate resins, and urethane resins.

A light-transmissive material having a refractive index between the refractive index of the wavelength conversion member and the refractive index of air may be embedded in the through-hole 4b of the light-distributing member 4. Examples of such a light-transmissive material include glass and sapphire.

As shown in FIG. 1B, the reflective film 6 is preferably disposed on the light-distributing member 4. In particular, the reflective film 6 is more preferably disposed on the inner walls defining the through-hole 4b, the lower surface 4c, the upper surface 4a, and/or outer lateral surfaces of the light-distributing member 4.

The reflective film 6 can be made of a material that can reflect 50% or more, preferably 80% or more, more preferably 90% or more or 95% or more of light from the light-emitting element. Examples of such materials include single-layer or multilayer film of metals such as gold, silver, copper, iron, nickel, chromium, aluminum, titanium, tantalum, tungsten, cobalt, ruthenium, tin, zinc, lead, or alloys of two or more of these metals (examples of Al alloys include an alloy of Al and a platinum-group metal such as Cu, Ag, and Pt). In the case where the reflective film 6 is made of a metal, in particular, a single-layer film of a metal of Al, Au, Ag, or Cr is preferably used. The reflective film 6 may be a dielectric multilayer film including a plurality of layers made of two or more types of dielectric substance. A distributed Bragg reflector (DBR) film is preferably used for the dielectric multilayer film.

Examples of dielectric substances constituting the DBR film include oxides and nitrides each containing at least one element selected from the group consisting of Si, Ti, Zr, Nb, Ta, and Al. In particular, a layered structure of oxides of elements such as Si, Zr, Nb, Ta, or Al is preferably used. With the reflective film 6, leakage of light from portions of the light-distributing member 4 other than the through-hole of the light-distributing member 4 can be prevented substantially completely. Further, deterioration of the light-distributing member due to irradiation of light from the light-emitting element can be reduced.

The thickness of the reflective film 6 is, for example, about several tenths to several tens of micrometers. The thickness of the reflective film 6 is preferably about 0.1 µm to 10 µm, more preferably about 0.3 µm to 7 µm.

Second Embodiment: Method of Manufacturing Light-Emitting Device

Figure 2A:
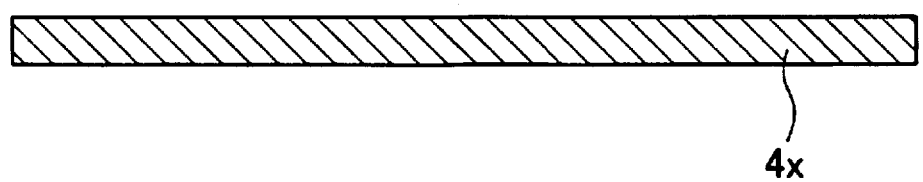
FIGS. 2A to 2C are schematic cross-sectional manufacturing-process diagrams illustrating a method of manufacturing the light-emitting device according to one embodiment of the present disclosure.
Figure 2B:
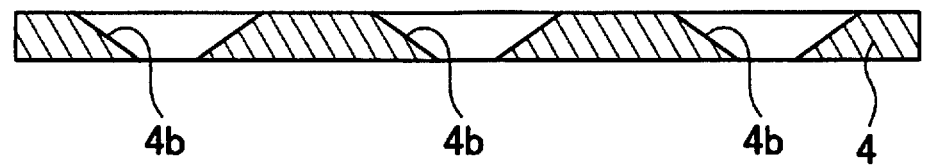
Figure 2C:
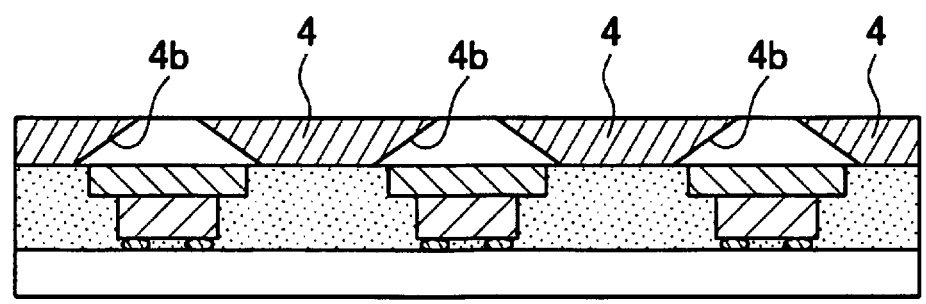
Figure 3A:
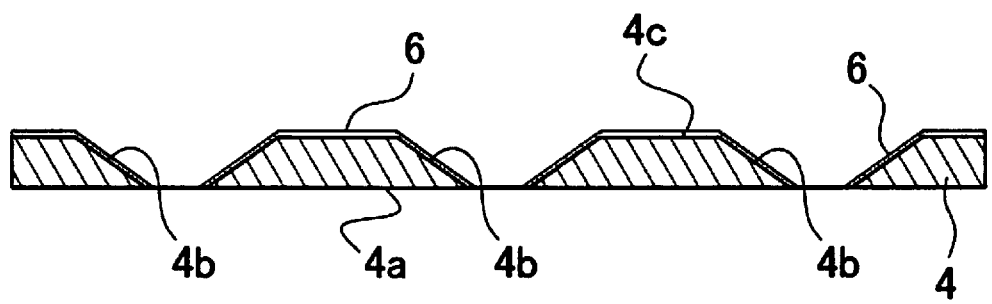
FIGS. 3A to 3B are schematic cross-sectional manufacturing-process diagrams illustrating a method of manufacturing the light-emitting device according to another embodiment of the present disclosure.
Figure 3B:
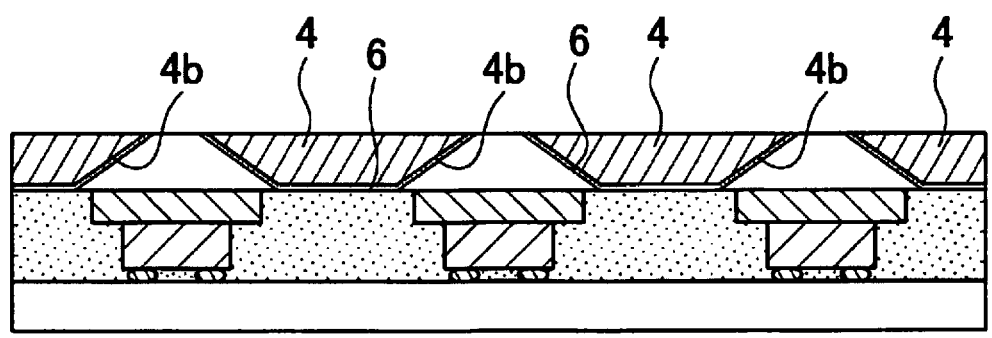
Figure 5A:
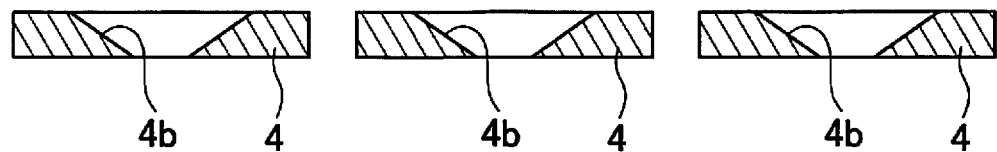
FIG. 5A is a schematic cross-sectional view illustrating a method of dividing the light-distributing member.
Figure 5B:
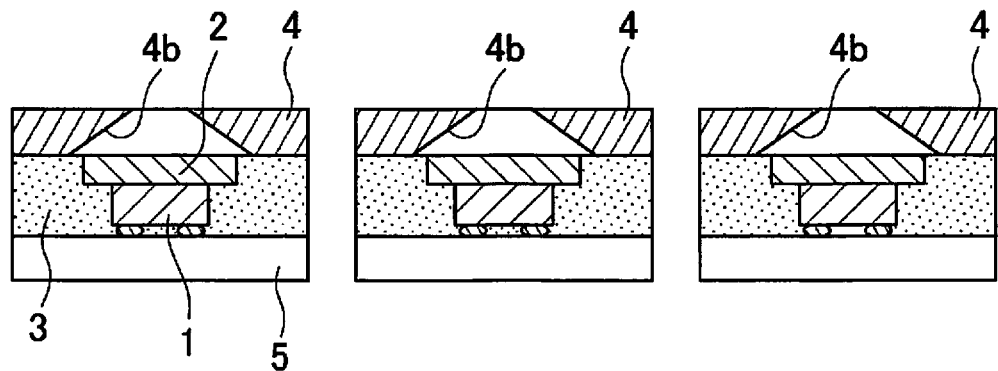
FIG. 5B is a schematic cross-sectional view for illustrating another method of dividing the light-distributing member.

The above-mentioned light-emitting devices 10 and 10A can be manufactured by using a method as described below.
First, a substrate 4x is provided as shown in FIG. 2A,
a light-distributing member 4 having a plurality of through-holes 4b each having inclined inner walls is formed by etching the substrate 4x as shown in FIG. 2B, and
a light-emitting element 1 configured to emit light from an upper surface thereof is disposed below each of the through-holes 4b of the light-distributing member 4 as shown in FIG. 2C and FIG. 3B.
This method allows for manufacturing the light-distributing member simply and easily, and allows for manufacturing the light-emitting device with the light-distributing member disposed at an appropriate position above the light-emitting element, which allows improvement in the yield, so that the manufacturing cost can be reduced.
This method of manufacturing preferably further includes forming a reflective film 6 on inner walls of each of the through-holes 4b of the light-distributing member 4 as shown in FIG. 3A, dividing the silicon substrate at an interval of one or more through-holes before or after disposing the light-emitting element 1 below each of the through-holes 4b of the light-distributing member 4 as shown in FIGS. 5A and 5B, disposing the wavelength conversion member 2 on the upper surface of the light-emitting element 1, and/or covering lateral surfaces of the light-emitting element 1 or continuously from the lateral surfaces of the light-emitting element 1 to lateral surfaces of the wavelength conversion member 2 by the light-reflective member 3.

Providing Substrate 4x

The substrate 4x, which constitutes the light-distributing member 4, for example, having a plate space or a sheet shape and made of any of the above-mentioned materials is provided (FIG. 2A). The substrate 4x preferably has flat upper and lower surfaces parallel to each other. A thickness of the substrate 4x can be adjusted as appropriate according to the size or the like of the light-emitting device to be obtained. It is preferable that a plurality of light-distributing members be obtained from one substrate, and accordingly the substrate may have a length and/or width of several centimeters to several tens of centimeters. The substrate 4x preferably has a uniform thickness, but may include portions having different thicknesses. The thickness of the substrate 4x can be in a range of, for example, 50 to several thousands of micrometers. The thickness of the substrate 4x may be about 50 μm to 1,000 μm, preferably 100 μm to 300 μm.

Among the materials that can be used for the light-distributing member 4, the substrate 4x is preferably made of a crystalline material, more preferably silicon, in view of easiness of forming the through-holes 4b. In the case where silicon is used for the substrate, in particular, the upper and lower surfaces of the substrate 4x parallel to each other are preferably constituted of the {110} plane. The "{110} plane" in the present specification refers to (110) plane, which is one of the crystal lattice planes of the diamond structure, which is a crystal structure of silicon stable under standard temperature and pressure, and all crystal planes equivalent to (110) plane. The "crystal planes equivalent to (110) plane" refers to a family of crystal planes or facets defined by a set of Miller indices and equivalent to (100) plane. Upper and lower surfaces of the silicon substrate may have an off angle of about ±2 degrees with respect to the {110} plane.

Forming Light-Distributing Member 4

The through-holes 4b are formed by etching the substrate 4x. The through-holes 4b can be formed by using a method known in the field of the invention including etching, such as forming a mask pattern with openings disposed on the upper or lower surface of the substrate 4x and, with use of the mask pattern, performing wet etching or dry etching that allows anisotropic etching. Among the etching techniques described above, wet etching is particularly preferable. An entirety of a surface of the substrate 4x on which the mask pattern is not formed is preferably covered with a mask depending on the etching method.

The mask pattern may have one opening but preferably have a plurality of openings corresponding to the number of light-emitting elements to be used.

The opening may have any appropriate shape and size that satisfies the above-described relationship with the outer edge of the light-emitting element is satisfied.

Figure 4A:
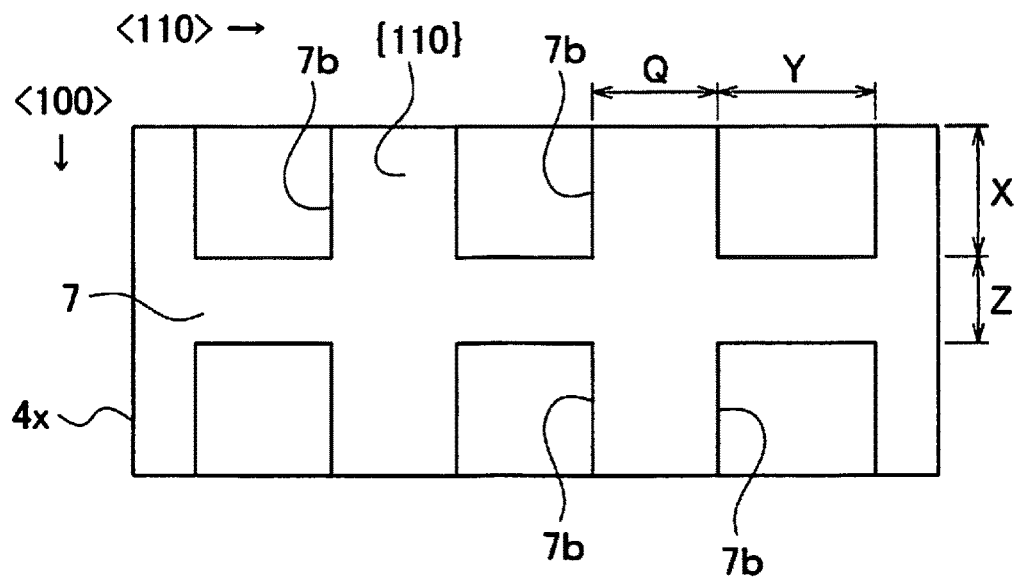
FIG. 4A is a schematic plan view illustrating one embodiment of a method of forming a light-distributing member.
Figure 4B:
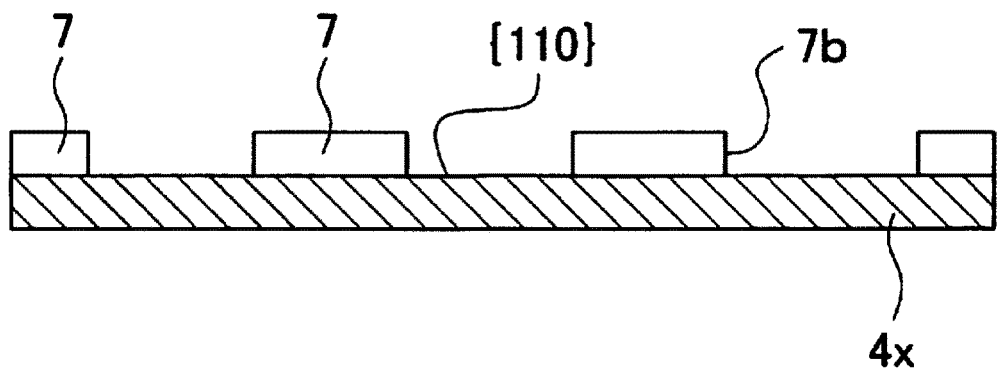
FIG. 4B is a schematic cross-sectional view illustrating one embodiment of a method of forming a light-distributing member.

In particular, in the case where a silicon substrate is used for the substrate 4x, as shown in FIGS. 4A and 4B, openings 7b of a mask pattern 7 have sides along, for example, the <100> direction, the <110> direction, and/or the <112> direction of the substrate 4x to be formed. In particular, the openings 7b preferably have sides along the <100> direction, and more preferably have sides along the <110> direction in addition to the sides along the <100> direction. With the openings to have the sides along the <100> direction, surfaces inclined at 45 degrees can be formed easily in the through-holes of the substrate 4x. In the present specification, the "<100> direction" refers to the direction perpendicular to the (100) plane, which is one of the crystal lattice planes of the diamond structure, which is a crystal structure of silicon stable under standard temperature and pressure, and all directions perpendicular to crystal planes equivalent to the (100) plane. Also, the outer edges (i.e., both ends) of openings having sides along the <100> direction are preferably substantially parallel to the <100> direction, and the outer edges (i.e., both ends) of openings having sides along the <110> direction are preferably substantially parallel to the <110> direction.

As shown in FIG. 4A, the openings 7b of the mask pattern 7 has a width Y along the <110> direction in a range of, for example, 200 μm to 1,000 μm. The openings 7b of the mask pattern 7 has a width X along the <100> direction in a range of, for example, 200 μm to 1,000 μm. The mask pattern 7 has a width X along the <110> direction in a range of, for example, 300 to 1,100 μm. The mask pattern 7 has a width Z along the <100> direction in a range of, for example, 300 μm to 1,100 μm.

The shape of each of the openings 7b of the mask pattern 7 can be adjusted as appropriate in accordance with characteristics of the light-distributing member to be obtained. In particular, the shape of each of the openings 7b preferably corresponds to the shape of the light-emitting element, and is preferably, for example, a quadrilateral shape having a pair or two pairs of sides parallel to each other. Examples of the quadrilateral shape include a square shape and a rectangular shape.

Each of the openings has a depth corresponding to a thickness of the mask pattern, and the depth can be, for example, 0.1 μm to 1 μm.

In the case where a plurality of openings are formed, the intervals between adjacent openings can be selected as appropriate in accordance with the intended size of the light-distributing member or the like. The intervals between adjacent openings is, for example, in a range of about 200 μm to 1,000 μm.

The mask pattern can be formed by forming a resist film or insulating film (e.g., oxide or nitride film of Si, Hf, Zr, Al, Ti, La, or the like, or a composite film two or more of these) and shaping the film through photolithography and etching techniques, or by using a material and method known in the field of the present invention, such as using a metal mask. In particular, a material of the mask pattern is preferably selected as appropriate in accordance with the type of the etchant in wet etching described below.

Wet etching for processing the light-distributing member may be performed under any conditions in which the above-described mask pattern is used for the mask and an etchant that allows for performing anisotropic etching is used. Examples of such an etchant include tetramethylammonium hydroxide (TMAH), potassium hydroxide, sodium hydroxide, ethylenediamine pyrocatechol (EDP), hydrazine, and mixed solutions of isopropanol and one or more of these. The concentration of the etchant can be selected as appropriate in view of the etching rate of the silicon substrate or the like. Among materials described above, TMAH, which is easy to handle, is preferably used. By using TMAH, etching the {110} plane of silicon substrate with higher anisotropy than other anisotropic etchants can be performed, and surfaces inclined at about 45 degrees with respect to the main surface of the {110} plane of silicon substrate can be formed precisely.

Examples of etching conditions include an etchant temperature of 80° C. to 110° C. and an immersion time of about 2 hours to 10 hours. The immersion time may be adjusted so that the desired amount of etching is obtained.

The inclined surfaces may be constituted of any crystal plane. In the case where openings having sides along the <100> direction are formed in the mask pattern used for the etching, the inclined surfaces to be formed are constituted of the {100} plane and have an inclination angle of about 45 degrees with respect to the upper or lower surface. On the other hand, in the case of forming openings having sides along the <110> direction in the mask pattern, the inclined surfaces to be formed are constituted of the {111} plane and have an inclination angle of about 35 degrees. The inclined surfaces may have an off angle of about ±2 degrees.

By continuing etching after the above-mentioned inclined surfaces are formed, depressed portions each having a trapezoidal shape or a truncated conical shape defined by inclined surfaces extending from sides facing each other of the openings are formed, and by further continuing the etching, through-holes are formed.

In the case where depressed portions corresponding to the openings of the mask pattern have been formed, the depressed portions and a surface opposite thereto may be subject to grinding or the like to form the depressed portions into through-holes.

Forming Reflective Film 6

The reflective film 6 is preferably disposed inside the through-holes 4b after forming the through-holes 4b in the substrate 4x. In this case, the reflective film may be formed only inside the through-holes using the above-described mask pattern, or the reflective film 6 may be formed on one surface of the light-distributing member 4 in addition to the inside of the through-holes 4b as shown in FIG. 3A after removing the mask pattern. Alternatively, the reflective film 6 may be formed on surfaces of the substrate 4x except for the through-holes 4b by forming, on one surface of the substrate 4x, a reflective film 6 having openings in portions corresponding to the through-holes 4b before forming the through-holes 4b in the substrate 4x, and forming the reflective film 6 on an entirety of other surfaces of the substrate 4x. The reflective film 6 may be disposed on the lateral surfaces of the light-distributing member 4. In the case where the reflective film 6 is formed before forming the through-holes 4b in the substrate 4x, etching is performed preferably in a state where the reflective film 6 is protected by the mask pattern.

The reflective film 6 may be formed on the upper surface 4a on which the openings of the light-distributing member 4 has a small width in FIG. 3A, the reflective film 6 may be formed only on the lower surface 4c on which the openings are large in width, may be formed inside the through-holes 4b and on the lower surface 4c as shown in FIG. 3A, or may be formed inside the through-holes 4b and on the upper surface 4a and the lower surface 4c.

The reflective film 6 can be formed by a known method such as vacuum evaporation, ion plating, ion vapor deposition (IVD), sputtering, ECR sputtering, plasma deposition, chemical vapor deposition (CVD), ECR-CVD, ECR-plasma CVD, electron-beam evaporation (EB), or atomic layer deposition (ALD).

In the case where the reflective film 6 is formed on the upper and lower surfaces constituted of the {110} plane of the silicon substrate and/or inside the through-holes, the reflective film 6 can be formed with good precision of angles, smoothness, and quality and good reflection. Accordingly, the reflection efficiency of the light-distributing member 4 can be enhanced. Also, the light-distributing member 4 can be manufactured easily, simply, precisely, and efficiently. Furthermore, the manufacturing cost of the light-distributing member can be reduced.

Disposing Wavelength Conversion Member 2

The wavelength conversion member 2 is disposed on the light-emitting element 1 preferably before disposing the light-emitting element 1 below the light-distributing member 4. In this case, the wavelength conversion member 2 is preferably disposed so as to cover the entire upper surface of the light-emitting element 1.

In the case where the wavelength conversion member 2 has a plate shape or a sheet shape as described above, the wavelength conversion member 2 is usually fixed to the light-emitting element 1 with an adhesive. For the adhesive, an adhesive material known in the field of the invention can be used. For example, an adhesive material that contains a silicone resin, an epoxy resin, a phenolic resin, a polycarbonate resin, an acrylic resin, or modified resin of these or a hybrid resin of two or more of these resins can be used. Among resins described above, a silicone resins, or modified or hybrid resin of a silicone resin has high light-transmissivity and have good resistance to heat and light, and thus are preferable. In the case where the adhesive is adhered to the surface of the light-emitting element through immersion, the adhesive may be used without diluting, or the adhesive diluted with an organic solvent or the like may be used.

Alternatively, the wavelength conversion member 2 may be directly bonded to the light-emitting element 1 without the adhesive. For the direct bonding, for example, a surface-activated bonding, a hydroxy-group bonding, or an atomic diffusion bonding can be employed. In a surface-activated bonding, surfaces to be bonded are processed in a vacuum to achieve a surface state that allows for easily establishing chemical bonds, and the surfaces to be bonded are joined. In hydroxy-group bonding, hydroxy groups are formed on surfaces to be bonded by, for example, atomic layer deposition, and the hydroxy groups on the surfaces to be bonded are allowed to form bonds. In atomic diffusion bonding, a metal film having a thickness equivalent to one atomic layer is formed on each surface to be bonded, and the surfaces to be bonded are brought in contact to each other in a vacuum or an inert gas atmosphere, so that the metal atoms are bonded to each other. Such direct bonding allows the light-emitting element 1 and the wavelength conversion member 2 to be unified under an environment close to room temperature.

Disposing Light-Reflective Member 3

The light-reflective member 3 is disposed on the lateral surfaces of the light-emitting element 1 preferably before disposing the light-emitting element 1 below the light-distributing member 4. The light-reflective member 3 may be disposed on the lateral surfaces of the light-emitting element 1 before disposing the wavelength conversion member 2 on the light-emitting element 1 but is preferably disposed so as to cover a portion or an entirety of both of the lateral surfaces of the light-emitting element 1 and the lateral surfaces of the wavelength conversion member 2 after disposing the wavelength conversion member 2 on the light-emitting element 1.

In the case where the light-emitting element 1 is mounted on the support substrate 5, the light-reflective member 3 is preferably disposed also on the lower surface of the light-emitting element 1, in other words, between the light-emitting element 1 and the support substrate 5.

The light-reflective member 3 can be disposed on the desired portions by dispensing, printing, potting, casting, spin coating, transfer molding, compression molding, or the like.

Disposing Light-Emitting Element 1

The emitting light-emitting element 1 configured to emit light from a top surface thereof is disposed below each of the through-holes 4b of the light-distributing member 4. In this case, the light-distributing member 4 is disposed so that the outer edge of the through-hole 4b is located at an outer side of outer edges of the light-emitting element 1 and/or outer edges of the wavelength conversion member 2. The light-distributing member 4 is preferably, for example, fixed above the wavelength conversion member 2 with an adhesive. The adhesive to be used can be selected as appropriate from the above-described examples of adhesives.

Dividing Light-Distributing Member 4

The light-distributing member 4 is preferably divided at an interval of one or more through-holes 4b before or after disposing the light-emitting element 1 below each of the through-holes 4b of the light-distributing member 4, as shown in FIGS. 5A and 5B. In other words, a plurality of through-holes 4b are formed at once in the substrate 4x, and then the substrate 4x is divided into light-distributing members 4 each having one through-hole 4b or divided into light-distributing members 4 each having a plurality of through-holes 4b such that each of the light-distributing members 4 is included in respective light-emitting device (FIG. 5A). The number of the through-holes 4b in one light-distributing member can be selected as appropriate in accordance with the number of the light-emitting elements 1 mounted in the light-emitting device.

The division can be performed by a method in which a known component or apparatus is used, such as using a blade or laser irradiation. In particular, in the case where a silicon substrate is used for the substrate, auxiliary grooves (e.g., V-shaped grooves) and/or cracks for division are preferably formed to perform the division. Such auxiliary grooves and/or cracks can be formed by a known method such as blade dicing and laser dicing. In particular, laser dicing, by which internal machining is possible, is preferably employed. With such a method, cracks can be formed on substantially an entirety of a surface of the substrate with any thickness, generation of debris at the time of the division can be reduced. In the case of using laser dicing that can perform internal machining, for example, laser light for internal machining is emitted from a laser dicer to form a crack directly below each of the V-shaped grooves, and then the silicon substrate is divided starting from the bottom of the V-groove with a breaking apparatus.

In the division of the light-distributing member 4, division of only the light-distributing member 4 may be performed, or the light-distributing member 4 may be divided together with the support substrate 5 and/or the light-reflective member 3 at an interval of one or more light-emitting elements 1 as shown in FIG. 5B after disposing a plurality of light-emitting elements 1 below the light-distributing member 4 in which a plurality of through-holes 4b have been formed. In the case where the light-distributing member 4 is divided together with the support substrate 5 and/or the light-reflective member 3 as described above, separate division into the individual light-emitting devices can be omitted, which allows for simplifying the manufacturing process, so that the manufacturing cost can be reduced.

In the light-emitting devices according to certain embodiments of the present invention, inexpensive light-distributing members with high quality can be used to obtain high-luminance light-emitting devices or the like, which are increasingly required recently, and the light-emitting devices can be used for various applications.

What is claimed is:

1. A light-emitting device comprising:
   a light-emitting element;
   a wavelength conversion member arranged on the light-emitting element;
   a light-reflective member covering lateral surfaces of the light-emitting element; and
   a light-distributing member made of silicon and defining a through-hole disposed above the wavelength conversion member, an upper edge of the through-hole defined by an upper surface of the light-distributing member being disposed on an inner side of an outer edge of the light-emitting element in plan view, a lower surface of the light-distributing member being arranged over an upper surface of the light-reflective member, wherein
   a lower edge of the through-hole defined by a lower surface of the light-distributing member is disposed on an outer side of the outer edge of the light-emitting element in plan view.

2. A light-emitting device comprising:
   light-emitting element;
   a wavelength conversion member arranged on the light-emitting element;
   a light-reflective member covering lateral surfaces of the light-emitting element;
   a light-distributing member made of silicon and defining a through-hole disposed above the wavelength conversion member, an upper edge of the through-hole defined by an upper surface of the light-distributing member being disposed on an inner side of an outer edge of the light-emitting element in plan view, a lower surface of the light-distributing member being arranged over an upper surface of the light-reflective member, the through-hole being defined by one or more inner walls of the light-distributing member, each of the inner walls being inclined from the upper edge of the through-hole defined by the upper surface of the light-distributing member toward a lower edge of the through-hole defined by the lower surface of the light-distributing member; and
   a reflective film arranged on each of the inner walls of the light-distributing member.

3. A method of manufacturing a light-emitting device comprising:
   providing a substrate;
   etching the substrate to form a light-distributing member defining a plurality of through-holes each having inclined inner walls;
   disposing a plurality of wavelength conversion members respectively above a plurality of light-emitting elements, the light-emitting elements being configured to emit light from upper surfaces thereof; and
   disposing the light-emitting elements and the wavelength conversion members respectively below each of the through-holes of the light-distributing member such that an upper edge of each of the through-holes defined by an upper surface of the light-distributing member being disposed on an inner side of an outer edge of a corresponding one of the light-emitting elements in plan view.

4. The method of manufacturing a light-emitting device according to claim 3, wherein
   the substrate is a silicon substrate.

5. The method of manufacturing a light-emitting device according to claim 3, wherein the etching of the substrate includes performing wet-etching.

6. The method of manufacturing a light-emitting device according to claim 3, further comprising forming a reflective film on each of the inner walls that define each of through-holes of the light-distributing member.

7. The method of manufacturing light-emitting device according to claim 3, further comprising dividing the light-distributing member at an interval of one or more through-holes, before or after the disposing of the light-emitting elements and the wavelength conversion members respectively below each of the through-holes of the light-distributing member.

8. The method of manufacturing a light-emitting device according to claim 3, wherein the disposing of the light-emitting elements and the wave length conversion members respectively below each of the through-holes of the light-distributing member includes disposing the light-distributing member above the wavelength conversion members that are respectively disposed on the upper surfaces of the light-emitting element.

9. The method of manufacturing a light-emitting device according to claim 3, the method further comprising after the disposing of the wavelength conversion members respectively above the light emitting elements, covering continuously from lateral surfaces of the light-emitting elements to lateral surfaces of the wavelength conversion members by light-reflective member, wherein the disposing of the wavelength conversion members above the light emitting elements includes disposing the wavelength conversion members respectively on the upper surfaces of the light-emitting elements.

10. The method of manufacturing the light emitting device according to claim 9, wherein the disposing of the light-emitting elements and the wavelength conversion members respectively below each of the through-holes of the light-distributing member includes arranging a lower surface of the light-distributing member over an upper surface of the light-reflective member.

* * * * *